(12) United States Patent
Lee et al.

(10) Patent No.: US 11,296,142 B2
(45) Date of Patent: Apr. 5, 2022

(54) LED PACKAGE SET AND LED BULB INCLUDING SAME

(71) Applicant: Seoul Semiconductor Co., Ltd., Ansan-si (KR)

(72) Inventors: Seong Jin Lee, Ansan-si (KR); Jong Kook Lee, Ansan-si (KR)

(73) Assignee: Seoul Semiconductor Co., Ltd., Ansan-si (KR)

( * ) Notice: Subject to any disclaimer, the term of this patent is extended or adjusted under 35 U.S.C. 154(b) by 0 days.

(21) Appl. No.: 16/618,004

(22) PCT Filed: May 30, 2018

(86) PCT No.: PCT/KR2018/006137
§ 371 (c)(1),
(2) Date: Nov. 27, 2019

(87) PCT Pub. No.: WO2018/221952
PCT Pub. Date: Dec. 6, 2018

(65) Prior Publication Data
US 2020/0168660 A1 May 28, 2020

(30) Foreign Application Priority Data
May 31, 2017 (KR) .................. 10-2017-0067992

(51) Int. Cl.
*H01L 27/15* (2006.01)
*H01L 33/50* (2010.01)
(Continued)

(52) U.S. Cl.
CPC ............ *H01L 27/153* (2013.01); *F21K 9/235* (2016.08); *H01L 33/502* (2013.01); *F21Y 2113/13* (2016.08); *F21Y 2115/10* (2016.08)

(58) Field of Classification Search
CPC ..... H01L 27/123; H01L 25/167; H01L 33/50; H01L 23/60; F01L 33/502; F21K 9/235; F21Y 2115/10
(Continued)

(56) References Cited

U.S. PATENT DOCUMENTS 8,018,151 B2  9/2011  Chung et al.
9,072,140 B2  6/2015  Takahashi et al.
(Continued)

FOREIGN PATENT DOCUMENTS

EP  2768282  8/2014
JP  2015-038853  2/2015
(Continued)

OTHER PUBLICATIONS

Extended European Search Report dated Nov. 27, 2020, issued in European Patent Application No. 18809817.2.
(Continued)

*Primary Examiner* — Thinh T Nguyen
(74) *Attorney, Agent, or Firm* — H.C. Park & Associates, PLC

(57) ABSTRACT

An LED package set including a substrate, a first LED package disposed on the substrate and including at least one first LED chip, a second LED package disposed on the substrate and including at least one second LED chip, and a resistor disposed on the substrate, connected to the first LED package in series, and connected to the second LED package in parallel, in which the second LED package is connected in parallel to the first LED package and the resistor, and the first LED package and the second LED package are configured to emit light having different color temperatures.

12 Claims, 4 Drawing Sheets

(51) Int. Cl.
*F21K 9/235* (2016.01)
*F21Y 113/13* (2016.01)
*F21Y 115/10* (2016.01)

(58) Field of Classification Search
USPC .................. 257/88, 98; 438/22, 24, 46, 47
See application file for complete search history.

(56) References Cited

U.S. PATENT DOCUMENTS

2013/0049632 A1    2/2013  Kim
2014/0232277 A1*   8/2014  Takahashi et al. ........................
                                                        H05B 33/0806
                                                              315/192
2014/0361697 A1   12/2014  Miskin et al.
2017/0268734 A1    9/2017  Kawaguchi et al.

FOREIGN PATENT DOCUMENTS

KR    10-2011-0021639    3/2011
KR    10-2011-0101515    9/2011
KR    10-2013-0021106    3/2013
WO       2016/084437     6/2016

OTHER PUBLICATIONS

International Search Report dated Sep. 5, 2018, issued in International Patent Application No. PCT/KR2018/006137.
Office Action dated Apr. 10, 2021 from the Korean Intellectual Property Office for Korean Patent Application No. 2017-0067992 (with English Translation).

* cited by examiner

LED PACKAGE SET AND LED BULB INCLUDING SAME

CROSS-REFERENCE TO RELATED APPLICATIONS

This application is a National Stage Entry of International Application No. PCT/KR2018/006137, filed on May 30, 2018, and claims priority from and the benefit of Korean Patent Application No. 10-2017-0067992, filed on May 31, 2017, each of which is hereby incorporated by reference for all purposes as if fully set forth herein.

BACKGROUND

Field

Exemplary embodiments of the invention relate generally to an LED package set and an LED bulb including the same.

Discussion of the Background

Conventionally, incandescent lamps using filaments have been widely used as luminaires. A filament-based incandescent lamp generally emits light by temperature radiation, which may occur when a tungsten filament is heated in a vacuum glass bulb to high temperature through application of electricity.

Such a typical incandescent lamp is not suitable for long-term use due to short lifespan of the filament and extremely low energy efficiency, since most of energy supplied thereto is released as heat and only a fraction of the energy is converted into light.

Recently, light emitting diodes (LEDs) having long lifespan and high energy efficiency are used in luminaires.

The above information disclosed in this Background section is only for understanding of the background of the inventive concepts, and, therefore, it may contain information that does not constitute prior art.

SUMMARY

LED packages and LED bulbs including the same constructed according to exemplary embodiments of the invention are capable of providing high economic efficiency due to long lifespan and low heat generation.

Exemplary embodiments also provide an LED package set, which allows regulation of color temperature of light emitted therefrom, and an LED bulb including the same.

Exemplary embodiments further provide an LED package set, which can evenly emit light in all directions by emitting light in different directions, and an LED bulb including the same.

Additional features of the inventive concepts will be set forth in the description which follows, and in part will be apparent from the description, or may be learned by practice of the inventive concepts.

An LED package set according to an exemplary embodiment includes a substrate, a first LED package disposed on the substrate and including at least one first LED chip, a second LED package disposed on the substrate and including at least one second LED chip, and a resistor disposed on the substrate, connected to the first LED package in series, and connected to the second LED package in parallel, in which the second LED package is connected in parallel to the first LED package and the resistor, and the first LED package and the second LED package are configured to emit light having different color temperatures.

The substrate may include a pair of electrode pads, each of the first LED package, second LED package, and the resistor may include a first end and a second end opposing the first end, the first end of the first LED package and the first end of the second LED package may be connected to one of the pair of electrode pads, the first end of the resistor may be connected to the second end of the first LED package, and the second end of the second LED package and the second end of the resistor may be connected to the other one of the pair of electrode pads.

Light from the first LED package may have a higher color temperature than light from the second LED package.

A difference in color temperature between light from the first LED package and light from the second LED package may be at least 500 K.

A difference in color temperature between light from the first LED package and light from the second LED package may be less than or equal to 1,000 K.

Current may be distributed to the first LED package and the second LED package depending a resistance formed by the first LED package and the resistor connected in series, and a resistance of the second LED package.

A color temperature of a mixture of light from the first LED package and the second LED package may change depending on current flowing through the first LED package and current flowing through the second LED package.

The first LED package may include a first wavelength conversion portion covering the at least one first LED chip, and the second LED package may include a second wavelength conversion portion covering the at least one second LED chip.

The first LED chip and the second LED chip may be configured to emit light having the same color temperature.

The first wavelength conversion portion and the second wavelength conversion portion may include phosphors having different color temperatures, respectively.

The LED package set may further include a wavelength conversion portion covering each the first LED chip and the second LED chip.

The first LED chip and the second LED chip may be configured to emit light having different color temperatures.

An LED bulb according to another exemplary embodiment includes a base including an external electrode pad to receive electricity from an external power supply, an LED package set including a substrate that includes a pair of electrode pads disposed at one end thereof, a first LED package including at least one first LED chip, a second LED package including at least one second LED chip, and a resistor, a holder including a connection portion to receive one end of the LED package set, and electrically connected to the pair of electrode pads of the substrate, and a light transmissive cover enclosing the LED package set and coupled to the base, in which the first LED package, the second LED package, and the resistor are disposed on the substrate, the first LED package and the second LED package are connected in parallel, and are configured to emit light having different color temperatures, and the resistor is connected to the first LED package in series and connected to the second LED package in parallel.

Each of the first LED package, second LED package, and the resistor may include a first end and a second end opposing the first end, the first end of the first LED package and the first end of the second LED package may be connected to one of the pair of electrode pads, the second end of the resistor may be connected to the second end of the first LED package, and the second end of the second LED package and the second end of the resistor may be connected to the other one of the pair of electrode pads.

Light from the first LED package may have a higher color temperature than light from the second LED package.

A difference in color temperature between light from the first LED package and light from the second LED package may be in a range of 500 K to 1,000 K.

The connection portion of the holder may include a groove or hole, to which one end of the substrate is inserted, and the connection portion may include a pair of connection terminals electrically connected to the pair of electrode pads of the substrate.

The substrate may further include a bent portion disposed between the pair of electrode pads and the first LED chip, the second LED chip, and the resistor, by which the substrate is bent in an upwards or downwards direction.

The first LED package may include a first wavelength conversion portion covering the first LED chip, the second LED package may include a second wavelength conversion portion covering the second LED chip, the first LED chip and the second LED chip may be configured to emit light having the same color temperature, and the first wavelength conversion portion and the second wavelength conversion portion may include phosphors having different color temperatures, respectively.

The LED bulb may further include a wavelength conversion portion covering each of the first LED chip and the second LED chip, in which the first wavelength conversion portion and the second wavelength conversion portion may include phosphors having different color temperatures, respectively.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the inventive concepts.

DETAILED DESCRIPTION

Figure 1:
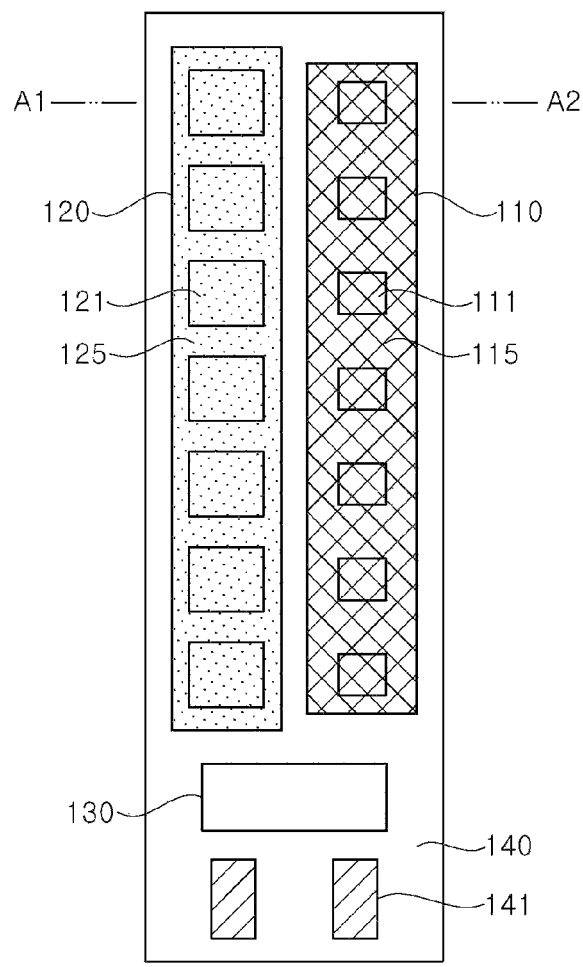
FIG. 1 and FIG. 2 are views of an LED package set according to an exemplary embodiment.

In the following description, for the purposes of explanation, numerous specific details are set forth in order to provide a thorough understanding of various exemplary embodiments or implementations of the invention. As used herein "embodiments" and "implementations" are interchangeable words that are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

As customary in the field, some exemplary embodiments are described and illustrated in the accompanying drawings in terms of functional blocks, units, and/or modules. Those skilled in the art will appreciate that these blocks, units, and/or modules are physically implemented by electronic (or optical) circuits, such as logic circuits, discrete components, microprocessors, hard-wired circuits, memory elements, wiring connections, and the like, which may be formed using semiconductor-based fabrication techniques or other manufacturing technologies. In the case of the blocks, units, and/or modules being implemented by microprocessors or other similar hardware, they may be programmed and controlled using software (e.g., microcode) to perform various functions discussed herein and may optionally be driven by firmware and/or software. It is also contemplated that each block, unit, and/or module may be implemented by dedicated hardware, or as a combination of dedicated hardware to perform some functions and a processor (e.g., one or more programmed microprocessors and associated circuitry) to perform other functions. Also, each block, unit, and/or module of some exemplary embodiments may be physically separated into two or more interacting and discrete blocks, units, and/or modules without departing from the scope of the inventive concepts. Further, the blocks, units, and/or modules of some exemplary embodiments may be physically combined into more complex blocks, units, and/or modules without departing from the scope of the inventive concepts.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

Figure 2:
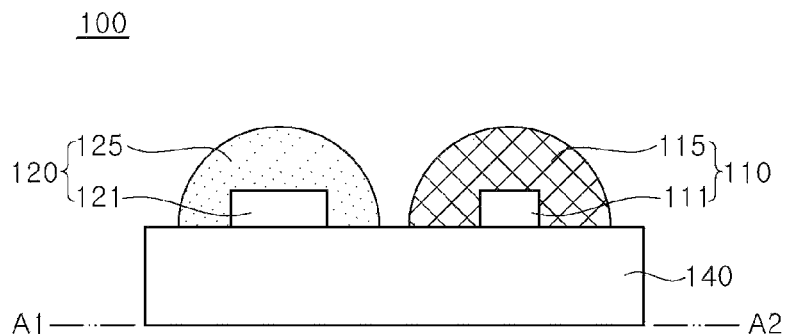

FIG. 1 and FIG. 2 are views of an LED package set according to an exemplary embodiment.

In particular, FIG. 1 is a plan view of an LED package set 100 according to an exemplary embodiment, and FIG. 2 is a cross-sectional view taken along line A1-A2 of the LED package set 100 of FIG. 1.

Referring to FIG. 1 and FIG. 2, the LED package set 100 includes a substrate 140, a first LED package 110, a second LED package 120, and a resistor 130. The LED package set 100 may be driven in a constant current mode.

The substrate 140 is a circuit substrate having a wiring circuit formed thereon. For example, the substrate 140 may be any substrate suitable for forming a wiring circuit thereon, such as a printed circuit board, a metal substrate, and a glass substrate. In some exemplary embodiments, the substrate 140 may be a metal substrate having high heat dissipation performance, which may allow a plurality of LED chips or LED packages to be disposed thereon.

The substrate 140 includes a pair of electrode pads 141 formed at one end thereof. The pair of electrode pads 141 receives electricity for driving the first LED package 110 and the second LED package 120 from the outside of the LED package set 100. In this case, electricity applied to the substrate 140 may be changed according to a dimming signal.

The pair of electrode pads 141 formed on the substrate 140 is electrically connected to the first LED package 110, the second LED package 120, and the resistor 130.

The first LED package 110 is disposed on the substrate 140. The first LED package 110 includes a first LED chip 111 and a first wavelength conversion portion 115.

The first LED package 110 may include at least one first LED chip 111. In this case, the first LED chips 111 of the first LED package 110 may be electrically connected to one another and form an array.

The first wavelength conversion portion 115 is formed on the substrate 140 and cover the first LED chip 111. The first wavelength conversion portion 115 may be formed to collectively cover multiple first LED chips 111. Alternatively, the first wavelength conversion portion 115 may be formed to individually cover each of the first LED chips 111.

The second LED package 120 is disposed on the substrate 140. The second LED package 120 includes a second LED chip 121 and a second wavelength conversion portion 125.

The second LED package 120 may include at least one second LED chip 121. When the second LED package 120 includes multiple second LED chips 121, the second LED chips 121 may be electrically connected to one another and form an array.

The second wavelength conversion portion 125 is formed on the substrate 140 and cover the second LED chip 121. The second wavelength conversion portion 125 may be formed to collectively cover multiple second LED chips 121. Alternatively, the second wavelength conversion portion 125 may be formed to individually cover each of the second LED chips 121.

The first LED package 110 and the second LED package 120 emit light of the same color. In addition, light from the first LED package 110 has a different color temperature than light from the second LED package 120. For example, the first LED package 110 and the second LED package 120 may emit white light having different color temperatures.

Light emitted from the first LED chip 111 and the second LED chip 121 is warm light. For example, light emitted from the first LED chip 111 and the second LED chip 121 has a color temperature of 1,000 K to 4,000 K. In some exemplary embodiments, light emitted from the first LED chip 111 and the second LED chip 121 has a color temperature of 1,600 K to 3,000 K.

In addition, the first wavelength conversion portion 115 and the second wavelength conversion portion 125 include different phosphors. Thus, light emitted from the first LED package 110 through the first wavelength conversion portion 115 has a different color temperature than light emitted from the second LED package 120 through the second wavelength conversion portion 125.

According to an exemplary embodiment, the first wavelength conversion portion 115 includes a phosphor having a higher color temperature. For example, the first wavelength conversion portion 115 may include a phosphor having a color temperature of about 3,000 K. In addition, the second wavelength conversion portion 125 includes a phosphor having a lower color temperature. For example, the second wavelength conversion portion 125 may include a phosphor having a color temperature of about 1,800 K.

Accordingly, light from the first LED package 110 has a higher color temperature than light from the second LED package 120. However, the inventive concepts are not limited thereto. For example, in an LED package according to another exemplary embodiment, light from the second LED package 120 has a higher color temperature than light from the first LED package 110, when light from the first LED package 110 and light from the second LED package 120 has a different color temperature from each other.

A difference in color temperature between light from the first LED package 110 and light from the second LED package 120 may range from 500 K to 1,000 K.

An LED package having a lower color temperature may have a lower light intensity than an LED package having a higher color temperature. Thus, in order to supplement light intensity of the second LED package 120 having a lower color temperature, the second LED chip 121 may have a wider light emitting area than the first LED chip 111. In particular, the second LED chip 121 may be larger than the first LED chip 111.

The resistor 130 may be disposed on the substrate 140 or embedded in the substrate 140. The resistor 130 may have a fixed resistance. The resistor 130 is adapted to distribute current to the first LED package 110 and the second LED package 120.

Although a wiring circuit is not shown in FIG. 1, the first LED package 110 is connected in series to the resistor 130. Further, the second LED package 120 is connected in parallel to the first LED package 110 and the resistor 130, which are connected in series.

The LED package set 100 according to the illustrated exemplary embodiment emits a mixture of light having different color temperatures.

Voltage changed in magnitude according to an external dimming signal is applied to the LED package set 100. A resistance ratio of the first LED package 110 to the second LED package 120 is changed depending on the change in voltage and the resistor 130.

Current is distributed to the first LED package 110 and the second LED package 120 in accordance to an inverse relationship to the resistance ratio.

As used herein, the dimming signal may refer to a signal that controls the magnitude of electricity applied to the substrate 140 to regulate color temperature of light emitted from the LED package set 100.

As current flowing through the first LED package 110 and the second LED package 120 is changed, the strength or brightness of light emitted from each of the first LED package 110 and the second LED package 120 is changed. Accordingly, a color temperature of mixed light from the LED package set 100 is regulated by the change in strength or brightness ratio between light from the first LED package 110 and light from the second LED package 120 having different color temperatures.

In the illustrated exemplary embodiment, the first LED package 110 and the second LED package 120 are described as including the first wavelength conversion portion 115 and the second wavelength conversion portion 125, respectively. However, the inventive concepts are not limited thereto. For example, in some exemplary embodiments, the first wavelength conversion portion 115 and the second wavelength conversion portion 125 may be omitted, when each of the first LED chip 111 and the second LED chip 121 emits light having a color and color temperature desired by a user.

In addition, the LED package set 100 according to the illustrated exemplary embodiment is described as including two LED packages emitting light having different color temperatures. However, the inventive concepts are not limited thereto. For example, in some exemplary embodiments, the LED package set 100 may include three or more LED packages emitting light having different color temperatures. In this case, the color temperature of light emitted from the LED package set 100 can be more accurately regulated by adjusting the resistance of resistors connected in series to the LED packages.

According to another exemplary embodiment, the first LED chip 111 of the first LED package 110 and the second LED chip 121 of the second LED package 120 may emit light having different color temperatures. In this case, the first LED package 110 and the second LED package 120 may be covered by a single common wavelength conversion portion.

According to still another exemplary embodiment, the first LED chip 111 of the first LED package 110 and the second LED chip 121 of the second LED package 120 may emit light having the same color temperature. More particularly, the first LED chip 111 may be the same as the second LED chip 121. In this case, the first wavelength conversion portion 115 of the first LED package 110 and the second wavelength conversion portion 125 of the second LED package 120 may include phosphors having different color temperatures.

Figure 3:
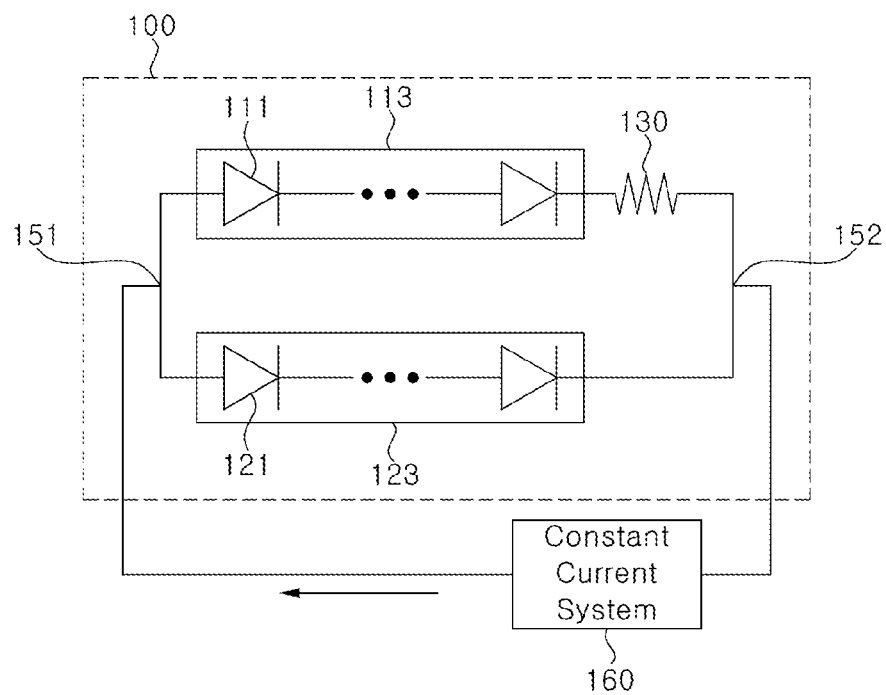
FIG. 3 is a circuit diagram of the LED package set according to an exemplary embodiment.

FIG. 3 is a circuit diagram of an LED package set according to an exemplary embodiment.

An LED package set 100 represented by the circuit of FIG. 3 is the LED package set 100 of FIG. 1 and FIG. 2.

Referring to FIG. 3, a first LED array 113 of the first LED package (110 of FIG. 1) is connected in series to the resistor 130. Here, one end of the resistor 130 is connected to a cathode of the first LED array 113, in particular, the other end of the first LED array. In addition, a second LED array 123 of the second LED package (120 of FIG. 2) is connected in parallel to the first LED array 113 and the resistor 130, which are connected in series. An anode of the first LED array 113 and an anode of the second LED array 123 are connected to a first terminal 151. In addition, the other end of the resistor 130 and a cathode of the second LED array 123 are connected to a second terminal 152. The first terminal 151 and the second terminal 152 are connected to opposite ends of a constant current system 160, respectively. The resistor 130 has a predetermined fixed resistance. As used herein, the constant current system 160 is a system that supplies electricity to the LED package set 100 in a constant current mode.

Electricity applied to the LED package set 100 is changed according to an external dimming signal. More particularly, voltage and current applied to the LED package set 100 are changed according to the external dimming signal. As voltage applied to the LED package set 110 is changed according to the dimming signal, a ratio between a resistance formed by the first LED package 110 and the resistor 130, and a resistance by the second LED package 120 is changed. Current from the constant current system 160 is distributed to the first LED package 110 and the second LED package 120 in inverse relationship to the ratio.

Hereinafter, the following example will be described with an assumption that the dimming signal indicates a dimming level of 100% when the light intensities of the first LED package (110 of FIG. 1) and the second LED package (120 of FIG. 2) reach the same maximum values, and that current applied to the LED package set has a maximum value of 30 mA.

In this example, the first LED package (110 of FIG. 1) has a color temperature of 3,000 K and the second LED package (120 of FIG. 2) has a color temperature of 1,800 K. Further, the resistor 130 has a resistance of 1 kΩ.

At a dimming level of 10%, a current of 3 mA is applied to the first terminal 151. In this case, all of the current flows through the second LED package (120 of FIG. 2). Thus, the first LED package (110 of FIG. 1) is in an OFF state. The second LED package (120, FIG. 2) emits light having an intensity corresponding to 3 mA. Since only the second LED package (120 of FIG. 2) emits light, light from the LED package set 100 has a color temperature of 1,800 K.

At a dimming level of 20%, a current of 6 mA is applied to the first terminal 151. In this case, a current of 1.2 mA flows through the first LED package (110 of FIG. 1) and a current of 4.8 mA flows through the second LED package (120 of FIG. 2). As a result, the LED package set 100 emits light having a color temperature of 2,100 K.

At a dimming level of 50%, a current of 15 mA is applied to the first terminal 151. In this case, a current of 4.5 mA flows through the first LED package (110 of FIG. 1) and a current of 10.5 mA flows through the second LED package (120 of FIG. 2). As a result, the LED package set 100 emits light having a color temperature of 2,400 K.

At a dimming level of 75%, a current of 22.5 mA is applied to the first terminal 151. In this case, a current of 9 mA flows through the first LED package (110 of FIG. 1) and a current of 13.5 mA flows through the second LED package (120 of FIG. 2). As a result, the LED package set 100 emits light having a color temperature of 2,550 K.

At a dimming level of 100%, a current of 30 mA is applied to the first terminal 151. In this case, a current of 15 mA flows through each of the first LED package (110 of FIG. 1) and the second LED package (120 of FIG. 2). As a result, the LED package set 100 emits light having a color temperature of 2,700 K.

In this manner, the LED package set 100 according to the illustrated exemplary embodiment can emit light having various color temperatures by distributing current to the first LED package (110 of FIG. 1) and the second LED package (120 of FIG. 2) according to the dimming signal.

Figure 4:
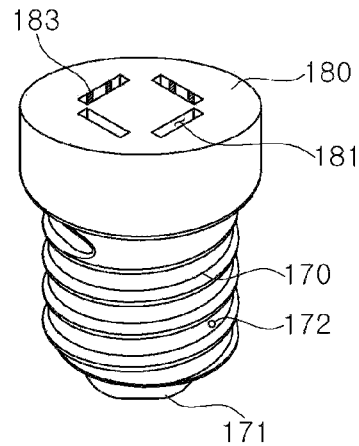
FIG. 4 and FIG. 5 are views of an LED bulb according to another exemplary embodiment.
Figure 5:
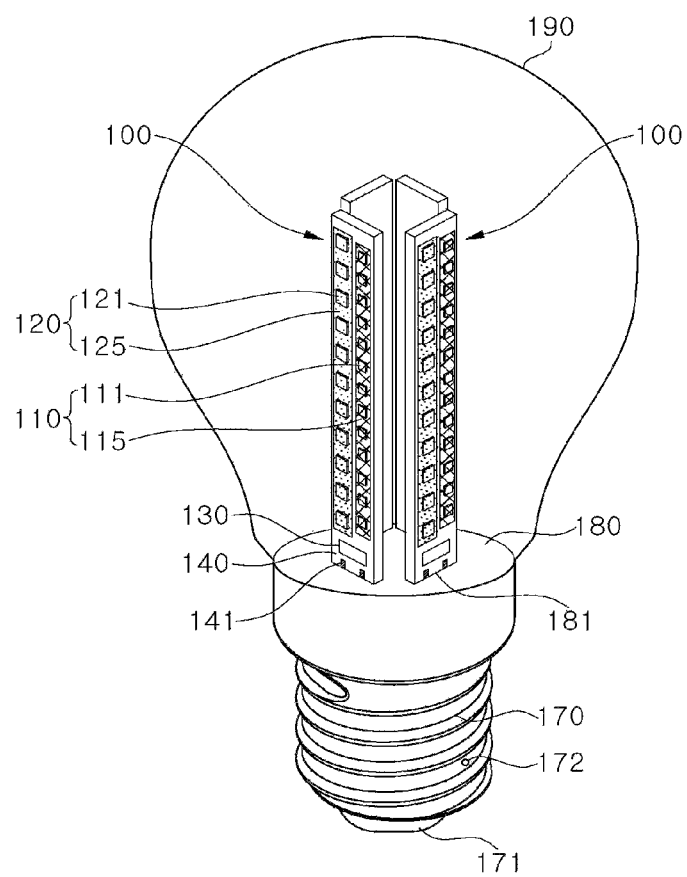

FIG. 4 and FIG. 5 are exemplary views of an LED bulb according to another exemplary embodiment.

FIG. 4 is an exemplary view of a base 170 and a holder 180 of an LED bulb 10, and FIG. 5 is an exemplary view of the LED bulb 10 with an LED package set 100 mounted on the base 170 and the holder 180 of FIG. 4.

Referring to FIGS. 4 and 5, the LED bulb 10 includes the base 170, the LED package set 100, the holder 180, and a light transmissive cover 190. The LED package set 100 may be the LED package set 100 described above with reference to FIG. 1 to FIG. 3.

The base 170 is coupled to a socket for connection to an external power supply. The base 170 includes a first external electrode 171 and a second external electrode 172 formed on an outer surface thereof and electrically connected to the socket. The first external electrode 171 and the second external electrode 172 receive electricity from the external power supply.

The light transmissive cover 190 is coupled to the base 170 to enclose internal components, such as the holder 180 and the LED package set 100. The light transmissive cover 190 is formed of a light transmissive material. For example, the light transmissive cover 190 is formed of glass.

The holder 180 and the LED package set 100 are disposed in the LED bulb 10. An interior of the LED bulb 10 may be an inner space defined when the base 170 is coupled to the light transmissive cover 190.

The holder 180 is disposed under the LED package set 100 to support the LED package set 100 in an upright position. Referring to FIG. 4, the holder 180 includes a connection portion 181 provided in the form of a groove or a through-hole. The connection portion 181 includes a pair of connection terminals 183 formed of a conductive material. One of the pair of connection terminals 183 is electrically connected to the first external electrode 171 of the base 170, and the other connection terminal 183 is electrically connected to the second external electrode 172 of the base 170. The pair of connection terminals 183 is connected to the first external electrode 171 and the second external electrode 172 of the base 170 via conductive parts, such as wires, respectively. In the illustrated exemplary embodiment, the holder 180 is being described as a separate component from the base 170. However, the inventive concepts are not limited thereto, and in some exemplary embodiments, the holder 180 may be integrally formed with the base 170.

The LED bulb 10 includes at least one LED package set 100. In FIG. 5, the LED bulb 10 is shown as including four LED package sets 100. However, the inventive concepts are not limited thereto, and the number of LED package sets 100 mounted on the LED bulb 10 may be varied as needed.

The LED package set 100 is secured to the holder 180. One end of the LED package set 100 is inserted into the connection portion 181 of the holder 180. Thus, the LED package set 100 is disposed in an upright position inside the LED bulb 10. More particularly, the LED package set 100 may be disposed, such that the first LED package 110 and the second LED package 120 face an inner surface of the light transmissive cover 190.

In addition, the one end of the LED package set 100 inserted into the connection portion 181 corresponds to one end of the substrate 140, at which the pair of electrode pads 141 is formed. When the one end of the LED package set 100 is inserted into the connection portion 181, the pair of connection terminals 183 of the connection portion 181 is brought into contact with and electrically connected to the pair of electrode pads 141 of the substrate 140. Accordingly, electricity changed according to the dimming signal is applied to the LED package set 100 through the first external electrode 171 and the second external electrode 172 of the base 170 and the pair of connection terminals 183 of the holder 180.

Since the LED bulb 10 has a configuration, in which the LED package set 100 is secured by being inserted into the holder 180, the LED package set 100 may be easily replaced upon failure of the LED package set 100.

According to the exemplary embodiments, the LED package set 100 allows light intensities of the first LED package 110 and the second LED package 120 to be regulated depending on current applied thereto. In particular, the color temperature of light emitted from the LED bulb 10 is changed in accordance with the change in current applied from the outside. Thus, the LED bulb 10 can emit light having a color temperature suitable for a specific application or environment.

In addition, according to the exemplary embodiments, the LED package set 100 includes the resistor 130 connected in series to the first LED package 110, and connected in parallel to the second LED package 120. In addition, current is distributed to the first LED package 110 and the second LED package 120 depending on the resistance formed by the first LED package 110 and the resistor 130, and the resistance of the second LED package 120. Thus, the LED bulb 10 can emit light, in which a color temperature thereof may be changed according to the dimming signal.

In addition, according to the exemplary embodiments, the LED bulb 10 can evenly emit light laterally by including the plurality of LED package sets 100.

Figure 6:
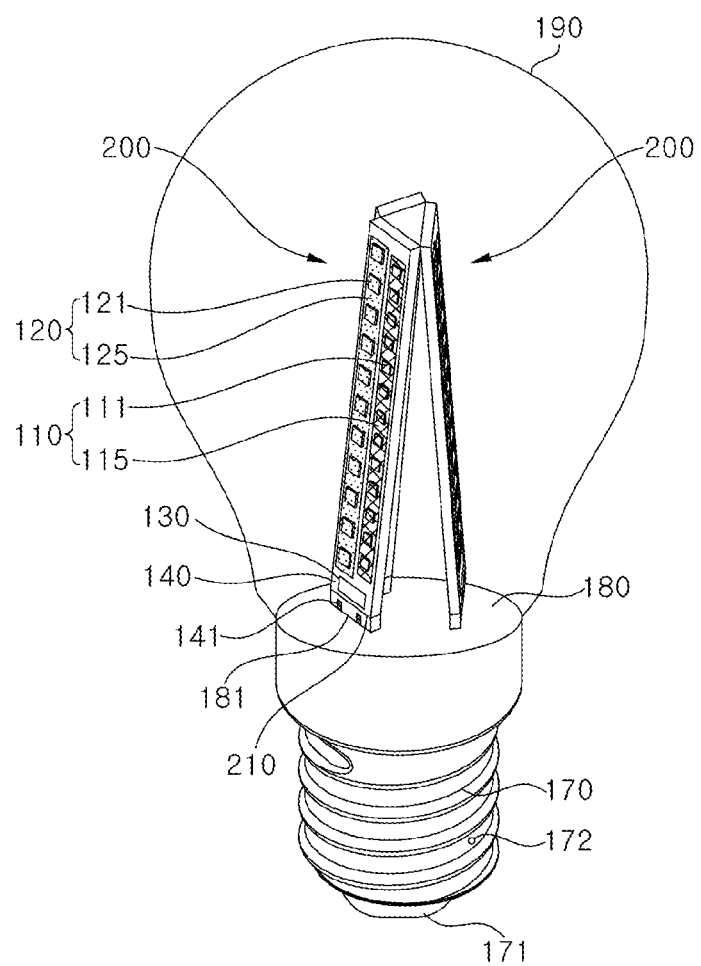
FIG. 6 is a view of an LED bulb according to still another exemplary embodiment.

FIG. 6 is an exemplary view of an LED bulb according to still another exemplary embodiment.

The LED bulb 20 according to the illustrated exemplary embodiment is substantially the same as the LED bulb 20 of FIG. 5, and thus, repeated descriptions of the substantially the same components thereof will be omitted to avoid redundancy.

Referring to FIG. 6, the LED bulb 20 according to the illustrated exemplary embodiment includes at least one LED package set 200. The LED package set 200 is formed with a bent portion 210. The bent portion 210 is formed on the substrate 140 between the pair of electrode pads 141 and the first LED chip 111, the second LED chip 121, and the resistor 130. In addition, the bent portion 210 is formed in a transverse direction of the substrate 140. As used herein, the transverse direction of the substrate 140 is a perpendicular direction with respect to a straight line connecting one end of the substrate 140, at which the pair of electrode pads 141 is formed, to the other end of the substrate 140.

The bent portion 210 is provided to bend the LED package set 200 at a predetermined angle. The bent portion 210 may be formed in any shape and by any method, so long as the LED package set 200 can be bent with respect to the bent portion 210. For example, the bent portion 210 may be formed by half-etching a portion of the substrate 140. Alternatively, the bent portion 210 may be provided in the form of at least one through-hole formed through a portion of the substrate 140. Still alternatively, the bent portion 210 may be provided in the form of an indentation formed by pressing a pointed object into a portion of the substrate 140.

The LED package set 200 may be bent with respect to the bent portion 210, such that the first LED package 110 and the second LED package 120 face in an upward direction of the LED bulb 20, as shown in FIG. 6.

In this manner, the LED bulb 20 including the LED package sets 200 as shown in FIG. 6 can evenly emit light upwards as well as laterally.

Alternatively, the LED bulb 20 may include an LED package set 200 bent downwards, as opposed to FIG. 6, to evenly emit light laterally and downwards. Still alternatively, the LED bulb 20 may include both an LED package set bent upwards and an LED package set bent downwards to evenly emit light laterally, upwards, and downwards.

According to exemplary embodiments, an LED package set and an LED bulb including the same can have long lifespan and low heat generation by employing an LED package, instead of a tungsten filament, thereby improving economic efficiency.

In addition, the LED package set and the LED bulb including the same can emit light having a suitable color temperature according to an environment by using at least two LED packages emitting light having different color temperatures.

Further, the LED package set and the LED bulb including the same include a resistor connected in series to one LED package and connected in parallel to the other LED package. Thus, the LED package set and the LED bulb can emit light having a color temperature that may be changed in accordance to voltage and current supplied to the LED package set.

Although certain exemplary embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

The invention claimed is:

1. An LED package set comprising:
   a substrate;
   a first LED package disposed on the substrate and comprising at least one first LED chip;
   a second LED package disposed on the substrate and comprising at least one second LED chip; and
   a resistor disposed on the substrate, connected to the first LED package in series, and connected to the second LED package in parallel,
   wherein the second LED package is connected in parallel to the first LED package and the resistor, and
   wherein the first LED package is configured to emit light having a higher color temperature than light emitted from the second LED package.

2. The LED package set according to claim 1, wherein:
   the substrate comprises a pair of electrode pads;
   each of the first LED package, second LED package, and the resistor includes a first end and a second end opposing the first end;
   the first end of the first LED package and the first end of the second LED package are connected to one of the pair of electrode pads;
   the first end of the resistor is connected to the second end of the first LED package; and
   the second end of the second LED package and the second end of the resistor are connected to the other one of the pair of electrode pads.

3. The LED package set according to claim 1, wherein a difference in color temperature between light from the first LED package and light from the second LED package is at least 500 K.

4. The LED package set according to claim 3, wherein a difference in color temperature between light from the first LED package and light from the second LED package is less than or equal to 1,000 K.

5. The LED package set according to claim 1, wherein current is distributed to the first LED package and the second LED package depending on a resistance formed by the first LED package and the resistor connected in series, and a resistance of the second LED package.

6. The LED package set according to claim 5, wherein a color temperature of a mixture of light from the first LED package and the second LED package changes depending on current flowing through the first LED package and current flowing through the second LED package.

7. The LED package set according to claim 1, wherein:
the first LED package comprises a first wavelength conversion portion covering the at least one first LED chip; and
the second LED package comprises a second wavelength conversion portion covering the at least one second LED chip.

8. The LED package set according to claim 7, wherein the first LED chip and the second LED chip are configured to emit light having the same color temperature.

9. The LED package set according to claim 8, wherein the first wavelength conversion portion and the second wavelength conversion portion comprise phosphors having different color temperatures, respectively.

10. The LED package set according to claim 1, further comprising a wavelength conversion portion covering each the first LED chip and the second LED chip.

11. The LED package set according to claim 10, wherein the first LED chip and the second LED chip are configured to emit light having different color temperatures.

12. The LED package set according to claim 1, wherein the second LED chip has a wider light emitting area than that of the first LED chip.

* * * * *